(12) United States Patent
Yamamoto

(10) Patent No.: US 6,504,185 B2
(45) Date of Patent: Jan. 7, 2003

(54) COMPOUND SEMICONDUCTOR DEVICE AND METHOD FOR CONTROLLING CHARACTERISTICS OF THE SAME

(75) Inventor: Nobusuke Yamamoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/873,208

(22) Filed: Jun. 5, 2001

(65) Prior Publication Data

US 2001/0028070 A1 Oct. 11, 2001

Related U.S. Application Data

(62) Division of application No. 09/044,009, filed on Mar. 19, 1998.

(30) Foreign Application Priority Data

Mar. 26, 1997 (JP) .............................................. 9-073396

(51) Int. Cl.$^7$ .............................................. H01L 29/74
(52) U.S. Cl. .................. 257/154; 257/61; 257/146; 257/181; 257/503; 257/630; 257/631
(58) Field of Search .................. 257/61.146, 154, 257/181, 503, 630, 631

(56) References Cited

U.S. PATENT DOCUMENTS 4,013,483 A    3/1977  Nuzillat et al. ............... 438/11
4,215,333 A *  7/1980  Huang ......................... 338/322
5,300,795 A    4/1994  Saunier et al. ............... 257/192
5,500,553 A *  3/1996  Ikegami ....................... 257/538
5,650,335 A    7/1997  Terazono ....................... 438/10

FOREIGN PATENT DOCUMENTS

JP         07-045633         2/1995

* cited by examiner

Primary Examiner—Phat X. Cao
Assistant Examiner—Wai-Sing Louie
(74) Attorney, Agent, or Firm—Volentine Francos, PL

(57) ABSTRACT

A compound semiconductor device is formed having a plurality of FETs exhibiting the same electrode ratio of a difference between a surface area of the active region and the combined overlapping surface area of the source and drain ohmic electrodes to the combined overlapping surface area of the source and drain ohmic electrodes. As such, precise control of a threshold voltage of the FETs is achieved. The compound semiconductor device is also formed so as to include a plurality of resistors having the same ratio of a difference between a surface area of the resistivity region and the combined overlapping surface area of the pair electrodes to the combined overlapping surface area of the pair electrodes. In this manner, a resistivity of the resistor is precisely controlled.

4 Claims, 6 Drawing Sheets

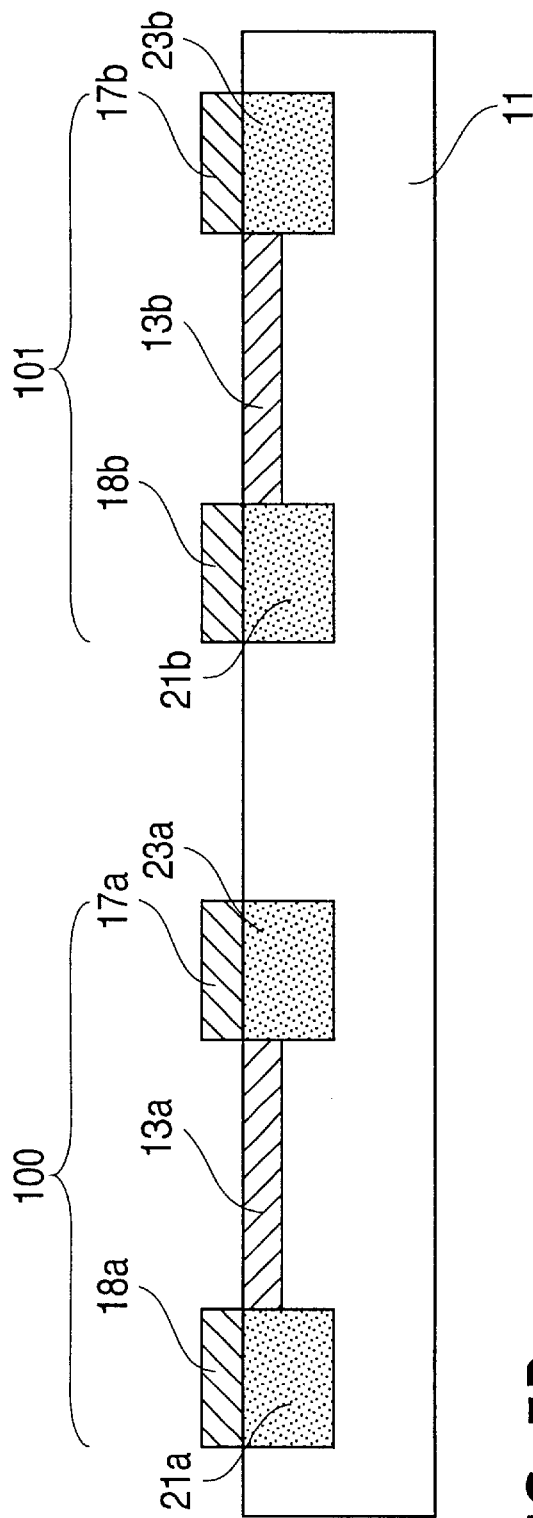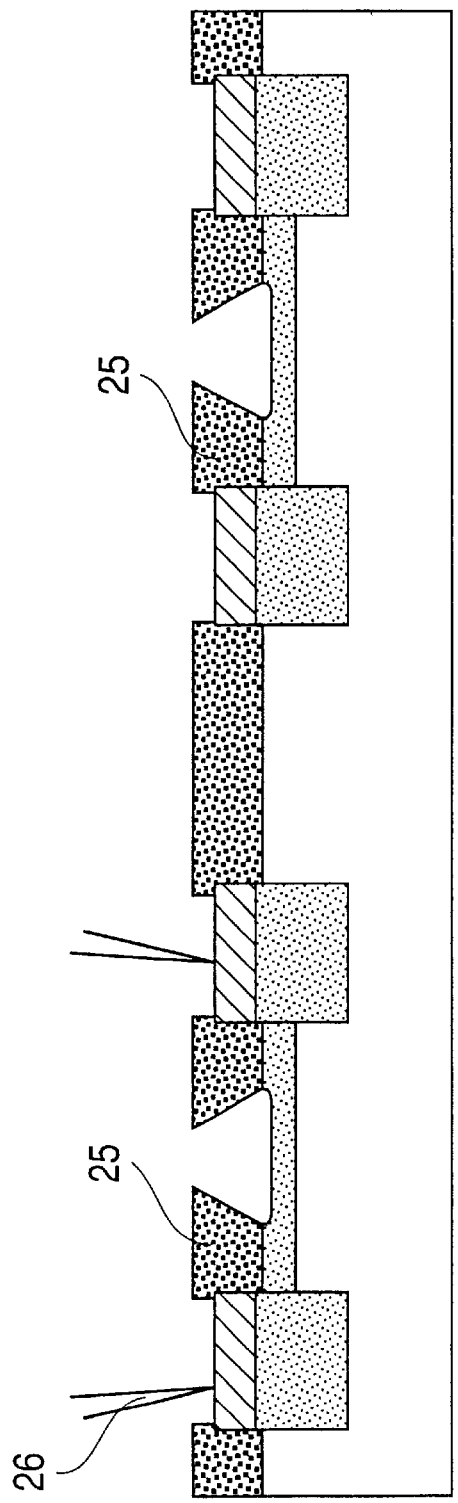

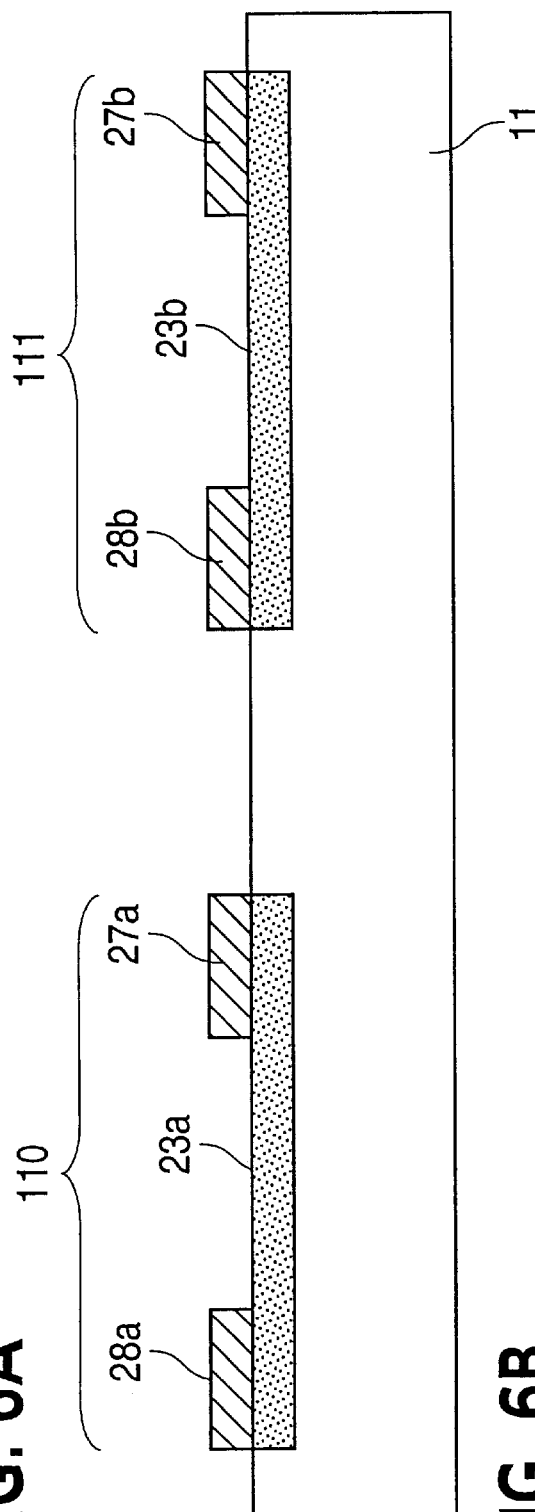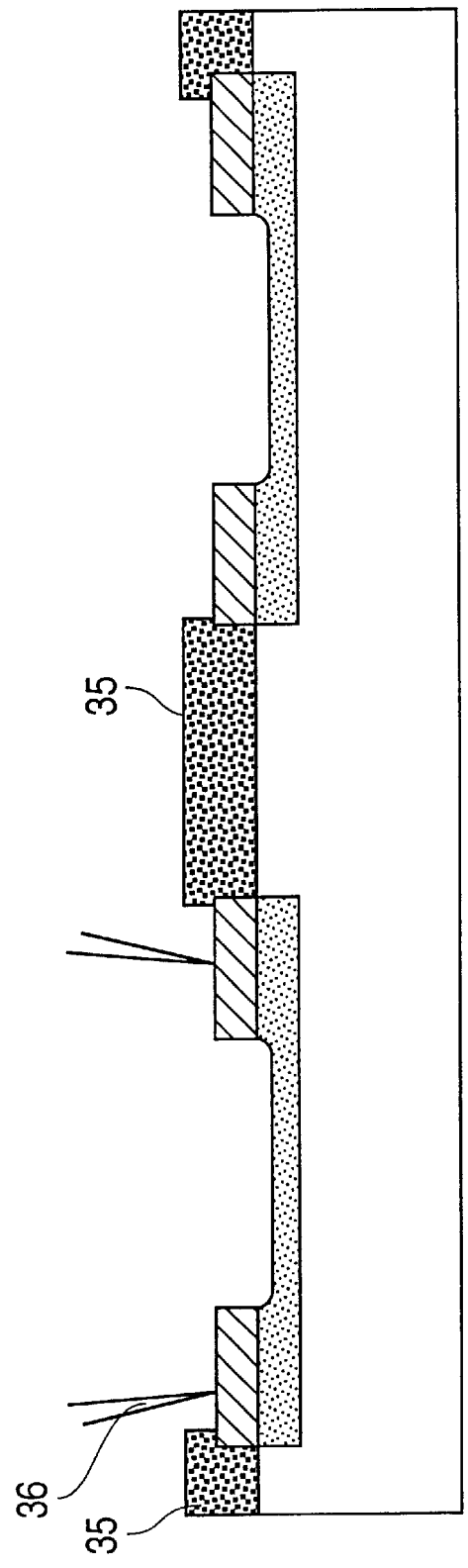

COMPOUND SEMICONDUCTOR DEVICE AND METHOD FOR CONTROLLING CHARACTERISTICS OF THE SAME

CROSS REFERENCE TO RELATED APPLICATIONS

This is a divisional application of application Ser. No. 09/044,009 filed Mar. 19, 1998, which is hereby incorporated by reference in its entirety for all purposes.

BACKGROUND OF THE INVENTION

1. Field of the Invention

The present invention generally relates to a compound semiconductor device and a method for controlling characteristics of the same, and more particularly, the present invention relates to a compound semiconductor device and a method for controlling characteristics of the same to obtain a homogeneous threshold voltage among plural transistors or a homogeneous resistivity among plural resistors.

This application is a counterpart of Japanese application Serial Number 073396/1997, filed Mar. 26, 1997, the subject matter of which is incorporated herein by reference.

2. Description of the Related Art

A conventional electronic component includes a plurality of field effect transistors and a plurality of resistors. The plurality of field effect transistors respectively have gates of different widths. Improved controllability of threshold voltages of the field effect transistors is important in stabilizing the performance of the electronic component.

The conventional method for controlling a threshold voltage of the field effect transistor is as follows:

First and second field effect transistors are simultaneously formed on the semiconductor chip. The second field effect transistor serves as a monitor for observing the process steps. That is, the threshold voltage of the second field effect transistor is measured after the ion-implantation for establishing a desired threshold voltage is completed. When the measured threshold voltage is lower than the desired value, the ion-implantation for establishing the desired threshold voltage is carried out for the second time.

SUMMARY OF THE INVENTION

An object of the present invention is to provide a compound semiconductor device that can precisely control a threshold voltage of a field effect transistor.

According to one aspect of the present invention, for achieving the above object, there is provided a compound semiconductor device comprising a first field effect transistor defining a first active region in a semi-insulating substrate, the first field effect transistor having a first ohmic source electrode and a first ohmic drain electrode extending over the first active region, a second field effect transistor defining a second active region in the semi-insulating substrate, the second field effect transistor having a second ohmic source electrode and a second ohmic drain electrode extending over the second active region, and wherein, a ratio of a difference between a surface area of the first active region and a combined surface area of the first source and drain ohmic electrodes to the combined surface area of the first source and drain ohmic electrodes is the same as a ratio of a difference between a surface area of the second active region and a combined surface area of the second source and drain ohmic electrodes to the combined surface area of the second source and drain ohmic electrodes.

An object of the present invention is to provide a compound semiconductor device that can precisely control a resistivity of the resistor.

According to one aspect of the present invention, for achieving the above object, there is provided a compound semiconductor device comprising a first resistor defining a first resistivity region in a semi-insulating substrate, the first resistor having a first pair electrodes extending over the first resistivity region, a second resistor defining a second resistivity region in the semi-insulating substrate, the second resistor having a second pair electrodes extending over the second resistivity region, and wherein, a ratio of a difference between a surface area of the first resistivity region and a combined surface area of the first electrodes to the combined surface area of the first electrodes is the same as a ratio of a difference between a surface area of the second resistivity region and a combined surface area of the second pair electrodes to the combined surface area of the second pair electrodes.

An object of the present invention is to provide a method for controlling a a characteristics of a compound semiconductor device that can satisfy homogeneity of the threshold voltages of the plurality of the field effect transistors at every substrate if a plurality of wafers treat using a single wafer processing.

According to one aspect of the present invention, for achieving the above object, there is provided a method for controlling a a characteristics of a compound semiconductor device comprising the steps of providing a first field effect transistor defining a first active region in a semi-insulating substrate, the first field effect transistor having a first ohmic source electrode and a first ohmic drain electrode extending over the first active region, a second field effect transistor defining a second active region in the semi-insulating substrate, the second field effect transistor having a second ohmic source electrode and a second ohmic drain electrode extending over the second active region, wherein, a ratio of a difference between a surface area of the first active region and a combined surface area of the first source and drain ohmic electrodes to the combined surface area of the first source and drain ohmic electrodes is the same as a ratio of a difference between a surface area of the second active region and a combined surface area of the second source and drain ohmic electrodes to the combined surface area of the second source and drain ohmic electrodes, measuring a threshold voltage of the second field effect transistor, and controlling a threshold voltage of the first field effect transistor based on the measured result.

According to another aspect of the present invention, for achieving the above object, there is provided a method for controlling a a characteristics of a compound semiconductor device comprising the steps of providing a first field effect transistor defining a first active region in a first semi-insulating substrate, the first field effect transistor having a first ohmic source electrode and a first ohmic drain electrode extending over the first active region, a second field effect transistor defining a second active region in a second semi-insulating substrate, the second field effect transistor having a second ohmic source electrode and a second ohmic drain electrode extending over the second active region, wherein, a ratio of a difference between a surface area of the first active region and a combined surface area of the first source and drain ohmic electrodes to the combined surface area of the first source and drain ohmic electrodes is the same as a ratio of a difference between a surface area of the second active region and a combined surface area of the second source and drain ohmic electrodes to the combined surface area of the second source and drain ohmic electrodes, measuring a threshold voltage of the second field effect transistor, and controlling a threshold voltage of the first field effect transistor based on the measured result.

An object of the present invention is to provide a method for controlling a a characteristics of a compound semiconductor device that can satisfy homogeneity of the resistivity of the plurality of the resistors at every substrate if a plurality of wafers treat using a single wafer processing.

According to one aspect of the present invention, for achieving the above object, there is provided a method for controlling a a characteristics of a compound semiconductor device comprising the steps of providing a first resistor defining a first resistivity region in a semi-insulating substrate, the first resistor having a first pair electrodes extending over the first resistivity region, a second resistor defining a second resistivity region in the semi-insulating substrate, the second resistor having a second pair electrodes extending over the second resistivity region, wherein, a ratio of a difference between a surface area of the first resistivity region and a combined surface area of the first electrodes to the combined surface area of the first electrodes is the same as a ratio of a difference between a surface area of the second resistivity region and a combined surface area of the second pair electrodes to the combined surface area of the second pair electrodes, measuring a resistivity of the second resistor, and controlling the resistivity of the first resistor based on the measured result.

According to another aspect of the present invention, for achieving the above object, there is provided a method for controlling a a characteristics of a compound semiconductor device comprising the steps of providing a first resistor defining a first resistivity region in a first semi-insulating substrate, the first resistor having a first pair electrodes extending over the first resistivity region, a second resistor defining a second resistivity region in a second semi-insulating substrate, the second resistor having a second pair electrodes extending over the second resistivity region, and wherein, a ratio of a difference between a surface area of the first resistivity region and a combined surface area of the first electrodes to the combined surface area of the first electrodes is the same as a ratio of a difference between a surface area of the second resistivity region and a combined surface area of the second pair electrodes to the combined surface area of the second pair electrodes, measuring a resistivity of the second resistor, and controlling the resistivity of the first resistor based on the measured result.

BRIEF DESCRIPTION OF THE DRAWINGS

While the specification concludes claims particularly pointing out and distinctly claiming the subject matter that is regarded as the invention, the invention, along with the objects, features, and advantages thereof, will be better understood from the following description taken in connection with the accompanying drawings, in which:

FIGS. 3A and B are cross-sectional views showing the steps of a method for controlling a a characteristics of a compound semiconductor device according to a first preferred embodiment of the present invention.

FIGS. 6A and B are cross-sectional views showing the steps of a method for controlling a a characteristics of a compound semiconductor device according to a second preferred embodiment of the present invention.

DETAILED DESCRIPTION OF THE PREFERRED EMBODIMENTS

A compound semiconductor device according to a first preferred embodiment of the present invention will hereinafter be described in detail with reference to the accompanying drawings.

Figure 1:
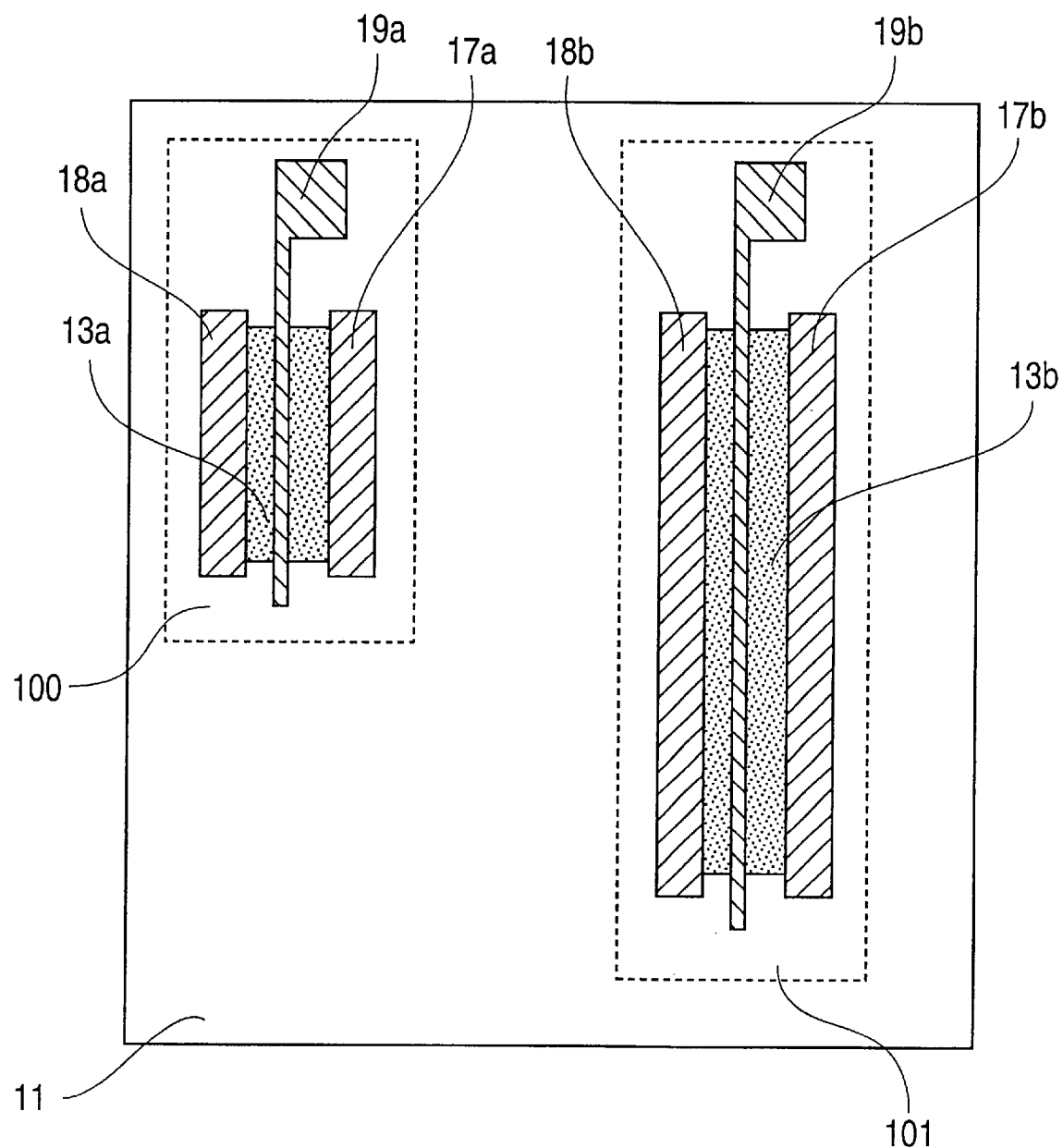
FIG. 1 is a plane view showing the compound semiconductor device according to a first preferred embodiment of the present invention.

FIG. 1 is a plane view showing the compound semiconductor device according to the first preferred embodiment of the present invention.

As shown in FIG. 1, the compound semiconductor device includes a first field effect transistor (FET) 100 and a second field effect transistor (FET) 101 formed on a GaAs substrate 11. The first FET 100 serves as a monitor for observing the process steps. The first FET 100 includes a first active region 13a, first source and drain ohmic electrodes 17a and 18a formed on source and drain regions (not shown) in the first active region 13a, and a first gate electrode 19a formed on the first active region 13a. The second FET 101 includes a second active region 13b, second source and drain ohmic electrodes 17b and 18b formed on source and drain regions (not shown) in the second active region 13b, and a second gate electrode 19b formed on the second active region 13b.

Each devices is characterized by an "electrode ratio" which is defined herein as the ratio of a difference between a surface area of the active region and a combined overlapping surface area of the source and drain regions (i.e., a surface portion of each of the source and drain electrodes which overlaps the active region) to the combined overlapping surface area of the source and drain regions. Here, the first FET 100 is characterized by a first electrode ratio a:b of (a) a difference between a surface area of the first active region 13a and a combined overlapping surface area of the first source and drain ohmic electrodes 17a and 18a to (b) the combined overlapping surface area of the first source and drain ohmic electrodes 17a and 18a. The second FET 101 is characterized by a second electrode ratio c:d of (c) a difference between a surface area of the second active region 13b and a combined overlapping surface area of the second source and drain ohmic electrodes 17b and 18b to (d) the combined overlapping surface area of the second source and drain ohmic electrodes 17b and 18b. According to the present invention, the first electrode ratio a/b is substantially the same as the second electrode ratio c/d.

Figure 2:
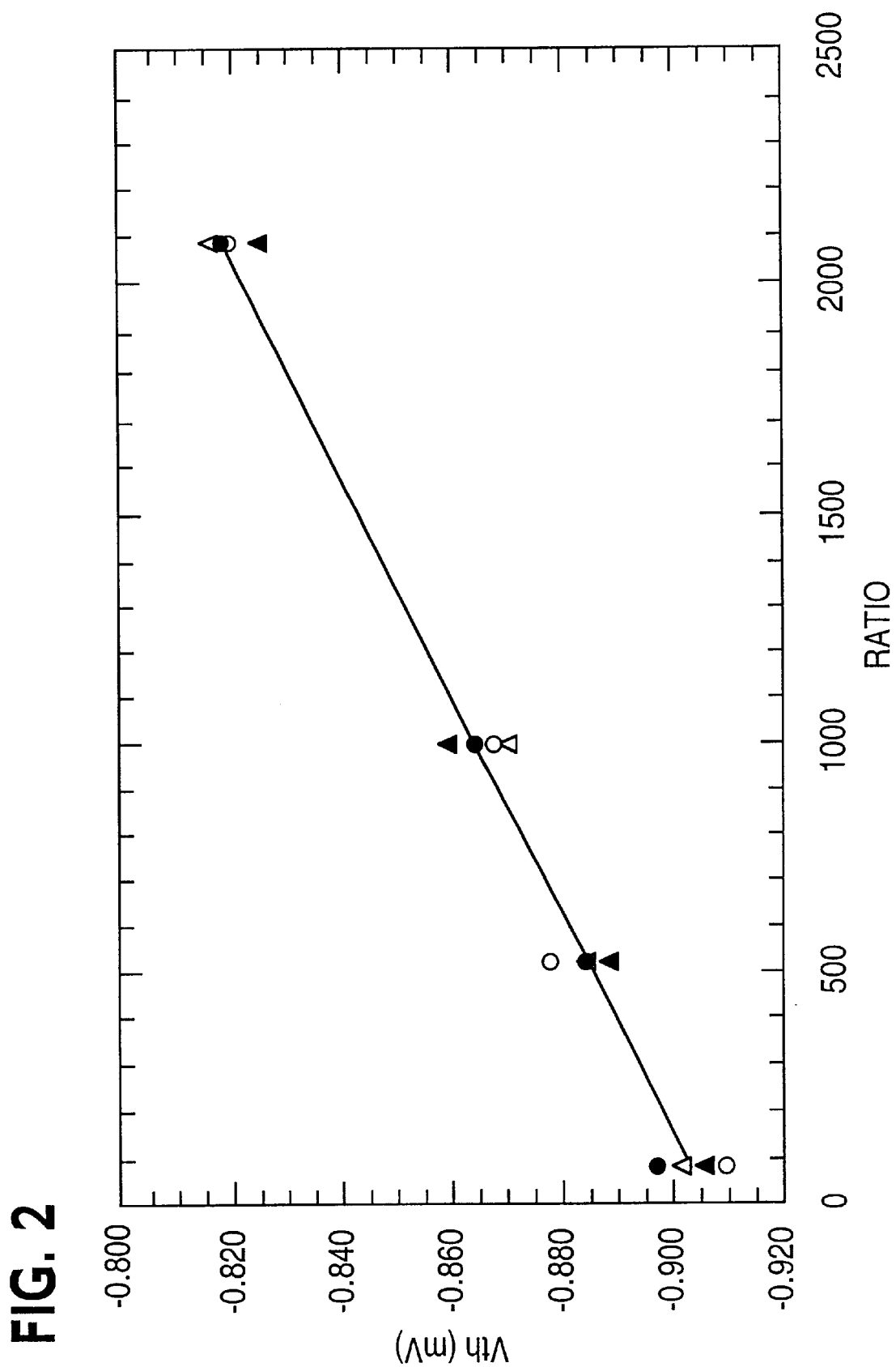
FIG. 2 is a diagram showing a relation between the threshold voltage and a ratio of a difference between a surface area of the active region and a combined surface area of the source and drain ohmic electrodes to the combined surface area of the source and drain ohmic electrodes.

FIG. 2 is a diagram showing measured relations between the threshold voltage and the electrode ratio of the devices. The plurality of FETs used for the measurements had respectively different gate widths (50 µm, 100 µm, 150 µm and 200 µm). The plurality of FETs were also formed so as to have the same electrode ratios.

As shown in FIG. 2, all of the plurality of FETs have substantially the same threshold voltage as a result of forming the plurality of FETs with the same electrode ratio, even though the plurality of FETs have respectively different gate widths. The electrode ratio is in proportion to the threshold voltage of the FETs.

As mentioned above, the plurality of FETs are respectively formed so as to have the same electrode ratio. As a result, all of the plurality of FETs have substantially the same threshold voltage. Further, by confirming the respective electrode ratios of the plurality of FETs in advance, the first preferred embodiment can precisely achieve the desired threshold voltages based on a diagram showing the relation between the threshold voltage and the electrode ratios.

A method for controlling characteristics of a compound semiconductor device according to a first preferred embodiment of the present invention will hereinafter be described in detail with reference to the accompanying drawings.

FIGS. 3A and B are cross-sectional views showing the steps of the method for controlling characteristics of the compound semiconductor device according to the first preferred embodiment of the present invention.

As shown in FIG. 3A, the compound semiconductor device includes the formation region of a first field effect transistor (FET) 100 and the formation region of a second field effect transistor (FET) 101 provided on a GaAs substrate 11. A first active region 13a, source and drain regions 21a and 23a in the first active region 13a for the first FET 100 and a second active region 13b, source and drain regions 21b and 23b in the second active region 13b for the second FET 101 respectively are formed by implanting Si as an n-type dopant and then annealing for an activation. First source and drain ohmic electrodes 17a and 18a are then respectively formed on the source and drain regions 21a and 23a, and second source and drain ohmic electrodes 17b and 18b are then respectively formed on the source and drain regions 21b and 23b. The electrodes are preferably a layer comprising an Au-Ge alloy layer and an Au-Ni alloy layer.

As shown in FIG. 3B, a photo-resist pattern 25 is formed on the entire substrate so as to expose upper surfaces of the electrodes 17a, 17b, 18a and so as to expose the predetermined portion of the first and second active regions 13a and 13b. The predetermined portion corresponds with formations regions of gate electrodes for the first and second FET 100 and 101.

Here, the first FET 100 has a first electrode a:b ratio of (a) a difference between a surface area of the first active region 13a and a combined overlapping surface area of the first source and drain ohmic electrodes 17a and 18a to (b) the combined overlapping surface area of the first source and drain ohmic electrodes 17a and 18a. The second FET 101 has a second electrode ratio c:d of (c) a difference between a surface area of the second active region 13b and a combined overlapping surface area of the second source and drain ohmic electrodes 17b and 18b to (d) the combined overlapping surface area of the second source and drain ohmic electrodes 17b and 18b. The first electrode ratio a/b is same as the second electrode ratio c/d.

Then, the first and second active regions 13a and 13b are etched to control a threshold voltage using the photo-resist pattern 25. Then, the threshold voltage of the first FET 100 is measured using probe needles. When the measured threshold voltage is lower than a predetermined value, the etching process is carried out again. The threshold of second FET 101 is indirectly controlled using the first FET 100 as a monitor.

As mentioned above, the plurality of FETs respectively are formed so as to have a same electrode ratio of a difference between a surface area of the active region and a combined overlapping surface area of the source and drain ohmic electrodes to the combined surface area of the source and drain ohmic electrodes. As a result, all of the plurality of FETs have substantially the same threshold voltage. Further, by confirming the respective electrode ratios of the plurality of FETs in advance, the first preferred method for controlling desired characteristics of a compound semiconductor device can precisely achieve the respective desired voltages based on a diagram showing a relation between threshold voltages and electrode ratios.

Further, the first preferred method for controlling characteristics of a compound semiconductor device can achieve homogeneity of the threshold voltages of the plurality of the field effect transistors at every substrate in the case where a plurality of wafers are treated using a single wafer processing.

A compound semiconductor device according to the second preferred embodiment of the present invention will hereinafter be described in detail with reference to the accompanying drawings.

Figure 4:
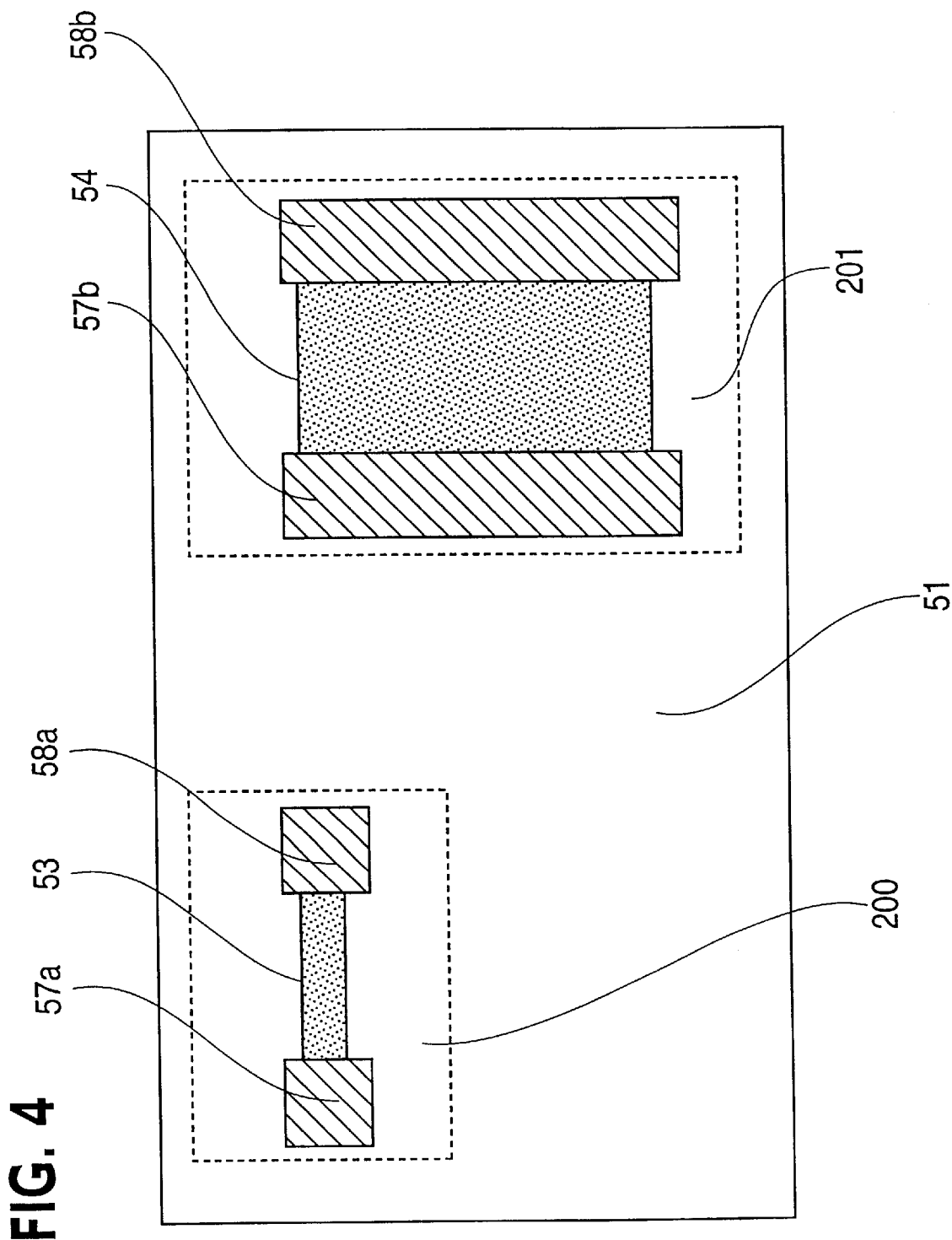
FIG. 4 is a plane view showing the compound semiconductor device according to a second preferred embodiment of the present invention.

FIG. 4 is a plane view showing the compound semiconductor device according to a second preferred embodiment of the present invention.

As shown in FIG. 4A, the compound semiconductor device include a first resistor 200 which is used as a monitor and a second resistor 201 formed on a GaAs substrate 11. The first resistor 200 includes a first resistivity region 53 and a first pair of electrodes 57a and 58a formed on the first resistivity region 53. The second resistor 201 includes a second resistivity region 54, a second pair of electrodes 57b and 58b formed on the second resistivity region 54.

Here, the first resistor 200 has a first electrode ratio which is defined as a ratio of a difference between a surface area of the first resistivity region 53 and a combined overlapping surface area of the first pair electrodes 57a and 58a to the combined overlapping surface area of the first pair of electrodes 57a and 58a. The second resistor 201 has a second electrode ratio of a difference between a surface area of the second resistivity region 54 and a combined overlapping surface area of the second pair of electrodes 57b and 58b to the combined overlapping surface area of the second pair of electrodes 57b and 58b. The first ratio is the same as the second ratio.

Figure 5:
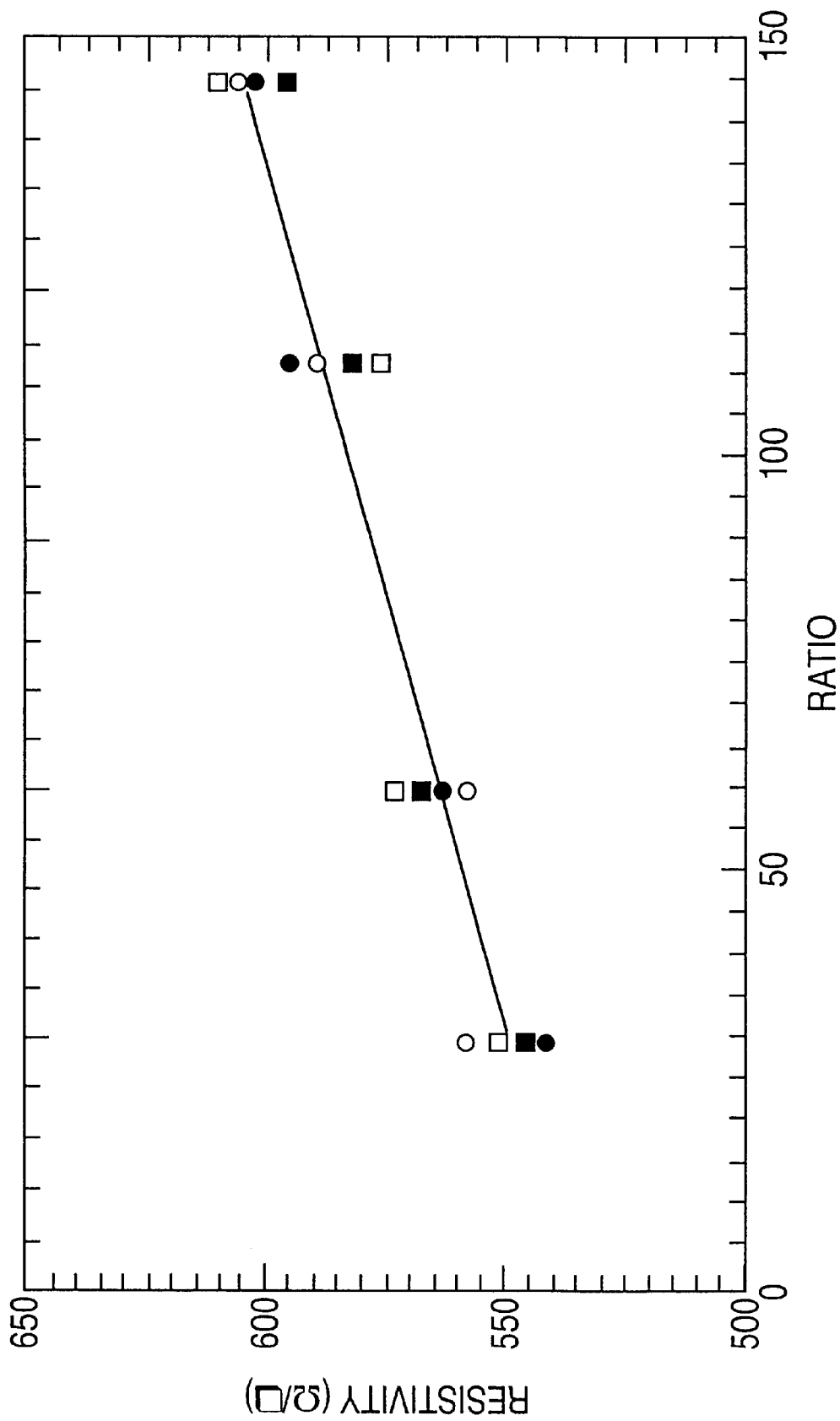
FIG. 5 is a diagram showing a relation between the resistivity of the resistor and a ratio of a difference between a surface area of the resistivity region and a combined surface area of the electrodes to the combined surface area of the electrodes.

FIG. 5 is a diagram showing relations between the resistivity of the electrode and electrode ratio of plural resistors. The plurality of resistors used for the measurement had respectively different resistivity region sizes. Here, the size of the resistivity region corresponds with the extending direction between the pair electrodes (50 $\mu$m, 100 $\mu$m, 150 $\mu$m and 200 $\mu$m). The plurality of resistors were also formed to as to have the same electrode ratios.

As shown in FIG. 5, all of the plurality of resistors have substantially the same resistivity as a result of forming the plurality of resistors with the same electrode ratio, even though the plurality of resistors have respectively different resistivity region sizes. The electrode ratio is in proportion to the resistivity of the resistors.

As mentioned above, the plurality of resistors are respectively formed so as to have a same electrode ratio. As a result, all of the plurality of resistors have substantially the same resistivity. Further, by confirming the respective electrode ratios of the plurality of resistors in advance, the second preferred embodiment precisely can achieve the desired resistivity based on a diagram showing a relation between resistivity and electrode ratio.

A method for controlling characteristics of a compound semiconductor device according to the second preferred embodiment of the present invention will hereinafter be described in detail with reference to the accompanying drawings.

FIGS. 6A and B are cross-sectional views showing the steps of a method for controlling characteristics of a compound semiconductor device according to a second preferred embodiment of the present invention.

As shown in FIG. 6A, the compound semiconductor device includes a formation region of a first resistor 110 used as a monitor and a formation region of a second resistor 111 provided on a GaAs substrate 11. First and second resistivity regions 23a and 23b are formed by implanting Si as an n-type dopant and then annealing for activation. First pair electrodes 27a and 28a are then formed on the resistivity region 23a, and second pair electrodes 27b and 28b are then formed on the resistivity regions 23b. Materials of the electrodes are preferably Au-Ge alloy/Ni/Au.

As shown in FIG. 6B, a photo-resist pattern 35 is formed on the entire substrate so as to expose upper surfaces of the electrodes 27a, 28a, 27b and 28b and the first and second resistivity regions 23a and 23b.

Here, the first resistor 110 has a first electrode ratio of a difference between a surface area of the first resistivity region 23a and a combined overlapping surface area of the first pair of electrodes 27a and 28a to the combined overlapping surface area of the first pair of electrodes 27a and 28a. The second resistor 111 has a second electrode ratio of a difference between a surface area of the second resistivity region 23b and a combined overlapping surface area of the second pair of electrodes 27b and 28b to the combined overlapping surface area of the second pair of electrodes 27b and 28b. The first electrode ratio is same as the second electrode ratio.

Then, the first and second resistivity regions 23a and 23b are etched to control a resistivity using the photo-resist pattern 25. Then, the resistivity of the first resistor 110 used as a monitor is measured using probe needles. When the measured resistivity is lower than a predetermined value, the etching process is carried out again. The second resistor 111 indirectly controls the resistivity using the first resistor 110 for a monitor.

As mentioned above, the plurality of resistors respectively are formed so as to have the same electrode ratio. As a result, all of the plurality of resistors have substantially the same resistivity. Further, by confirming the respective ratio of a plurality of resistors in advance, the second preferred method for controlling characteristics of a compound semiconductor device can precisely achieve the desired resistivity based on a diagram showing a relation between resistivity and electrode ratio.

Further, the second preferred method for controlling characteristics of a compound semiconductor device can achieve homogeneity of the resistivity of the plurality of the resistors at every substrate in the case where a plurality of wafers are treated using a single wafer processing.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A compound semiconductor device comprising:

a first resistor defining a first resistivity region in a semi-insulating substrate, the first resistor having a first pair electrodes extending over the first resistivity region;

a second resistor defining a second resistivity region in the semi-insulating substrate, the second resistor having a second pair electrodes extending over the second resistivity region; and wherein, a ratio of a difference between a surface area of the first resistivity region and a combined surface area of the first electrodes to the combined surface area of the first electrodes is the same as a ratio of a difference between a surface area of the second resistivity region and a combined surface area of the second pair electrodes to the combined surface area of the second pair electrodes.

2. A compound semiconductor device as claimed in claim 1, wherein the first and second resistors have the resistivity region of a different size.

3. A compound semiconductor device as claimed in claim 1, wherein a material of the electrodes has an ionization tendency more than a material of a dopant including the resistivity region.

4. A compound semiconductor device as claimed in claim 1, wherein the ohmic electrodes is a layer comprising an Au-Ge alloy layer and an Au-Ni alloy layer.

* * * * *